United States Patent [19]
Kearney

[11] Patent Number: 5,608,347
[45] Date of Patent: Mar. 4, 1997

[54] APPARATUS AND METHOD FOR DUAL SLOPE CALIBRATION OF A DIGITALLY CALIBRATED TRANSDUCER AMPLIFIER OVER TEMPERATURE

[75] Inventor: Mark B. Kearney, Kokomo, Ind.

[73] Assignee: Delco Electronics Corp., Kokomo, Ind.

[21] Appl. No.: 516,246

[22] Filed: Aug. 17, 1995

Related U.S. Application Data

[63] Continuation-in-part of Ser. No. 422,341, Apr. 14, 1995.

[51] Int. Cl.$^6$ .................................................. H01L 35/00
[52] U.S. Cl. ............................................ 327/512; 327/513
[58] Field of Search ................................... 327/512, 513, 327/83, 362

[56] References Cited

U.S. PATENT DOCUMENTS 3,914,623  10/1975  Clancy .................................... 327/134
5,481,220  1/1996  Mildren .................................. 327/513
5,532,627  7/1996  Kearney et al. ......................... 327/74
5,534,816  7/1996  Koglin et al. .......................... 327/513

*Primary Examiner*—Toan Tran
*Attorney, Agent, or Firm*—Jimmy L. Funke

[57] ABSTRACT

A temperature dependent signal compensation signal for generating a dual sloped calibration signal is disclosed. The temperature compensation circuit may be coupled to an integrated transducer amplifier circuit that applies the compensation signal for reducing error generated by changing operating temperatures. The signal compensation circuit provides for independent adjustment of the slope of the dual sloped compensation signal in response to changes in the operating temperature of the signal compensation circuit. A technique for generating and adjusting the slope of the dual sloped compensation signal in response to the operating temperature exceeding and falling below a first operating temperature is also disclosed.

21 Claims, 5 Drawing Sheets

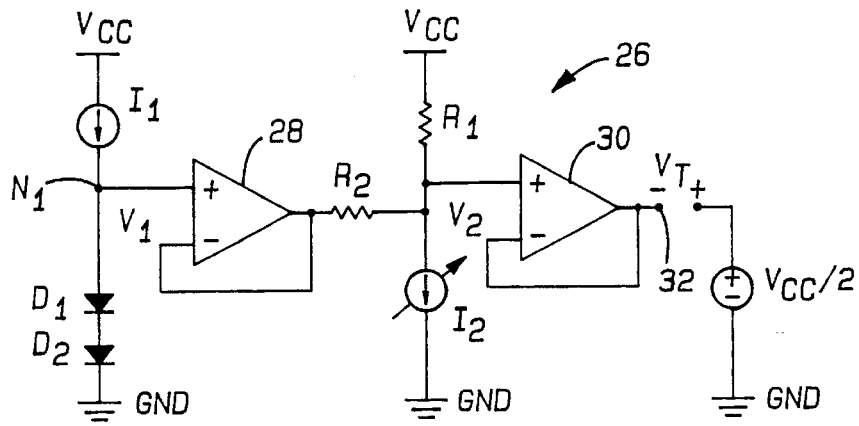
Fig-2
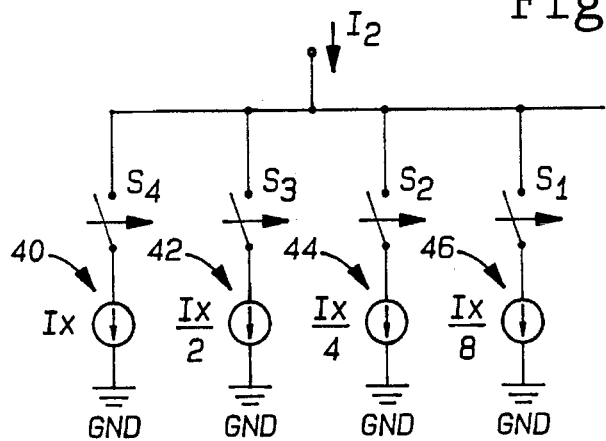
Fig-3
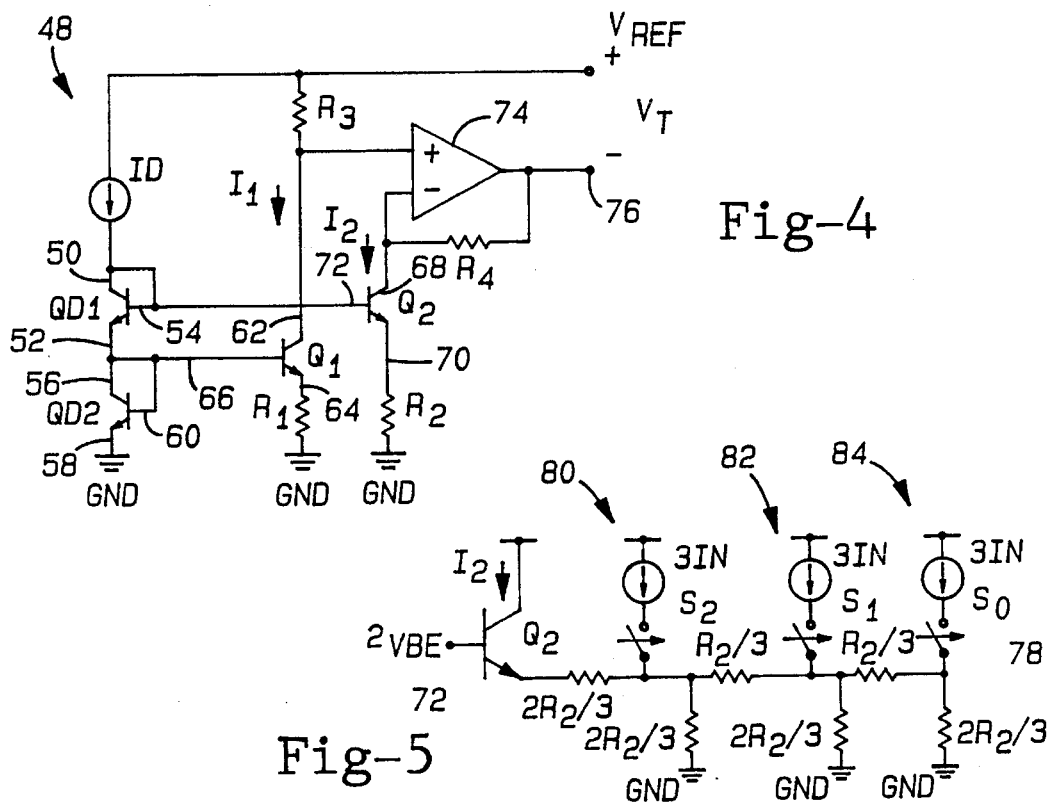
Fig-4
Fig-5

APPARATUS AND METHOD FOR DUAL SLOPE CALIBRATION OF A DIGITALLY CALIBRATED TRANSDUCER AMPLIFIER OVER TEMPERATURE

CROSS REFERENCE TO RELATED APPLICATION

This application is a continuation-in-part application of U.S. Ser. No. 08/422,341 filed Apr. 14, 1995 entitled "Temperature Dependent Voltage Generator with Binary Adjustable Null Voltage".

BACKGROUND OF THE INVENTION

1. Technical Field

This invention relates generally to integrated signal conditioning circuitry and, more particularly, to a temperature dependent signal compensation circuit and method for generating a dual sloped compensation signal that changes slope in response to changes in the operating temperature of the signal compensation circuit in order to compensate for effects due to temperature variations.

2. Discussion

Integrated amplifier circuits are commonly employed for amplifying output signals produced by a transducer. The transducer and integrated amplifier circuit are generally calibrated during a calibration process to set initial gain and offset characteristics and to generate a compensated calibrated output voltage. Often, these types of integrated circuits and transducers are subject to operating temperature variations which affect their operational characteristics. For example, operating temperature variations may affect the output of a transducer and, in turn, affect the gain and offset adjustments of an integrated amplifier circuit, resulting in an uncompensated output signal which may result in an inaccurate reading.

Typically, the gain and offset adjustments of an integrated amplifier circuit are adjusted at a first operating temperature such that the amplifier circuit generates a desired output signal. However, with variations in the operating temperature of the transducer and/or the amplifier circuit, unwanted effects on the output signal may be generated. Commonly, these unwanted effects are minimized by physically calibrating the individual components of the amplifier circuit prior to its final assembly. For example, the components may be individually calibrated with laser trimming techniques or through adjustment of resistive values of resistor networks by blowing fusible links. Unfortunately, these calibration techniques require physical access to the components of the amplifier circuit which are normally enclosed or encapsulated in a packaged housing after final assembly. Therefore, with laser trimming or fusible techniques, the calibration process must be performed prior to final assembly of the amplifier circuit.

It is therefore desirable to provide an integrated amplifier circuit and a method for compensating for signal variations due to changes in the operating temperature of the integrated amplifier circuit and/or a transducer without requiring physical access to the components of the amplifier circuit.

Yet, it may also be desirable to provide a temperature dependent signal compensation circuit that generates a dual sloped compensation signal that changes slope in response to changes in the operating temperature of the signal compensation circuit. For example, this dual sloped compensation signal may be supplied to primary and secondary gain and offset circuits of an integrated amplifier circuit in order to compensate for the unwanted effects due to temperature variations.

SUMMARY OF THE INVENTION

In accordance with the teachings of the present invention, a temperature dependent signal compensation circuit is provided for generating a dual sloped compensation signal that changes slope in response to changes in the operating temperature of the signal compensation circuit. The signal compensation circuit provides for independent adjustment of the slope of the dual sloped compensation signal. In addition, a technique for generating and adjusting the slope of the dual sloped compensation signal in response to the operating temperature exceeding and falling below a first operating temperature is taught.

In accordance with the teachings of a preferred embodiment, the temperature dependent signal compensation circuit includes a temperature dependent voltage generator subcircuit for generating an output voltage that is substantially proportional to changes in the operating temperature of the signal compensation circuit from the first operating temperature. The voltage generator subcircuit includes a temperature dependent voltage source for generating a voltage that varies substantially linearly with changes in the operating temperature from the first operating temperature and a binary weighted switch current source for generating an adjustable binary weighted current. At the first operating temperature, the binary weighted current is adjustable so as to null the output voltage. The temperature dependent signal compensation subcircuit further includes a switching subcircuit for selectively switching between and coupling a first sloped calibration signal and a second sloped calibration signal to the output voltage of the voltage generator subcircuit in response to the changes in the operating temperature. The dual sloped compensation signal is generated through the coupling of the first and second sloped calibration signals with the output voltage.

Use of the present invention provides an integrated amplifier circuit with a dual sloped compensation signal for compensating for signal variations that occur when the operating temperature of the integrated amplifier circuit exceeds and falls below the first operating temperature without requiring physical access to the components of the circuit. As a result, the aforementioned disadvantages associated with current integrated amplifier circuits have been substantially eliminated.

BRIEF DESCRIPTION OF THE DRAWINGS

Other objects and advantages of the present invention will become apparent to those skilled in the art upon reading the following detailed description and upon reference to the drawings in which:

FIG. 2 is a circuit diagram illustrating a first embodiment of a temperature dependent voltage generator circuit with adjustable null capability;

FIG. 3 is a circuit diagram illustrating binary weighted current sources used to produce the binary weighted current $I_2$ shown in FIG. 2;

FIG. 4 is a circuit diagram illustrating an alternate embodiment of the temperature dependent voltage generator circuit with adjustable null capability;

FIG. 5 is a circuit diagram illustrating a binary weighted switched current source which replaces resistor $R_2$ in FIG. 4 for supplying a binary weighted current;

DETAILED DESCRIPTION OF THE PREFERRED EMBODIMENTS

Figure 1:
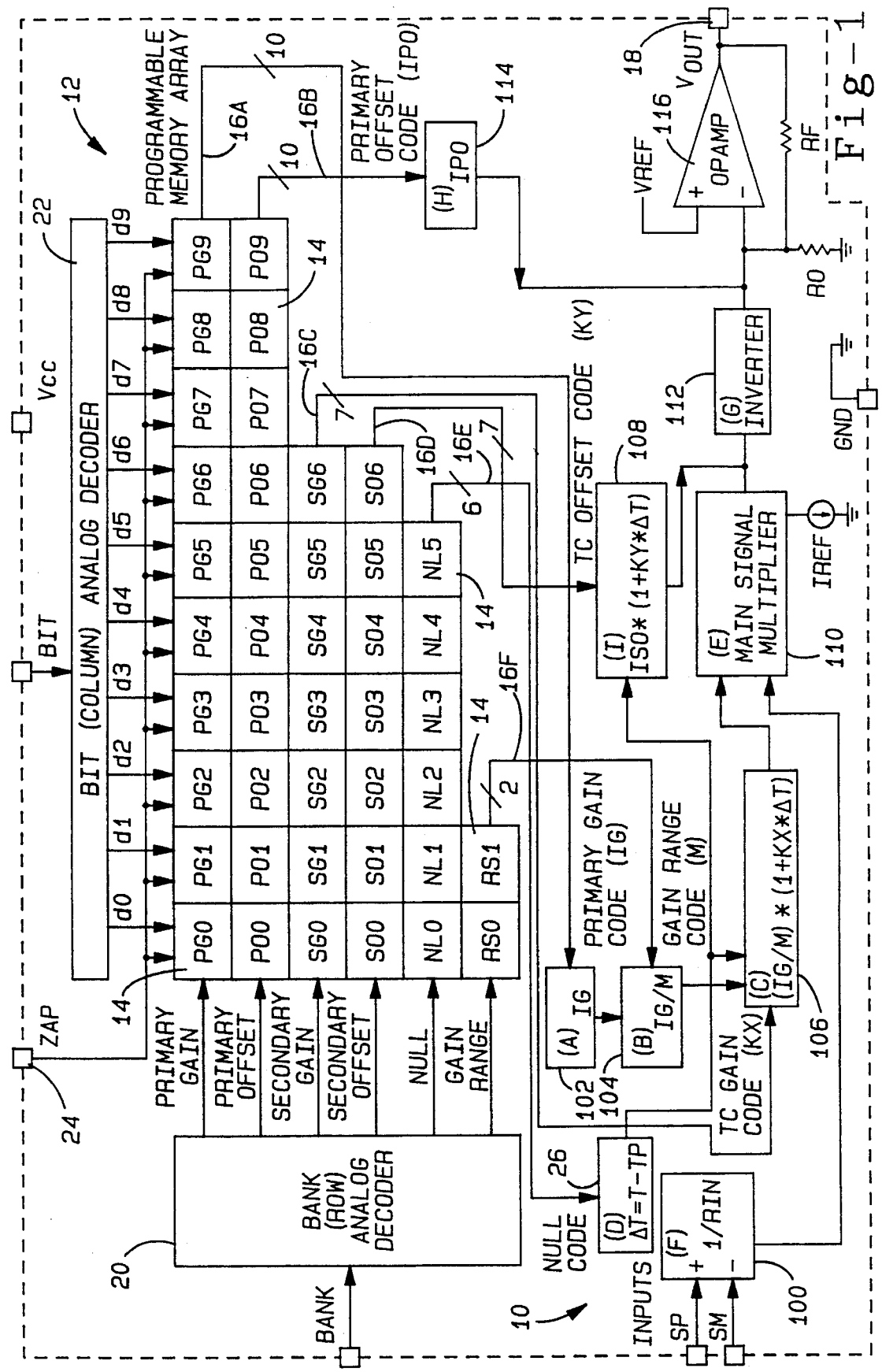
FIG. 1 is a block diagram of a piezoresistive transducer amplifier circuit containing a temperature dependent voltage generator circuit.

Turning now to FIG. 1, a piezoresistive transducer amplifier circuit 10 is shown interconnected to an electronically programmable memory array 12 which employs "zener-zap" memory cells 14. According to the example shown, the transducer amplifier circuit 10 has inputs for receiving differential outputs SP and SM from a piezoresistive transducer (not shown). The amplifier circuit 10 of the present invention is particularly suited for use in conjunction with a piezoresistive strain sensing transducer such as a pressure or an accelerometer transducer. These transducer outputs are typically very small and therefore require amplification to an amplitude that is more easily usable.

Each of the memory cells 14 have outputs that are coupled to the amplifier circuit 10 via lines 16A–16F. The transducer amplifier circuit 10 receives programmed binary bit signals which are provided by each of the memory cells 14. The binary bit signals provide digital coding which is used to program the amplifier circuit 10. The amplifier circuit 10 amplifies the transducer outputs SP and SM such that a compensated calibrated single-ended output voltage $V_{OUT}$ is generated at output line 18.

Each of the memory cells 14 in the electronically programmable memory array 12 are individually addressable via row decoder 20 and column decoder 22. Each of the memory cells 14 receive row and column address voltages from the decoders 20 and 22. When properly addressed, the memory cells 14 can be individually tested and/or programmed so as to output binary signals for adjusting amplifier characteristics, such as gain and offset, of the transducer amplifier circuit 10. Additionally, the memory cells 14 can be individually tested and/or programmed so as to output binary signals for adjusting a temperature dependent voltage generator 26 which is part of transducer amplifier circuit 10. In order to minimize the number of interconnections required for individually testing and/or programming the memory cells 14, each of the memory cells 14 have a common connection to a zap voltage line 24. The zap voltage line 24 is coupled to a voltage supply which provides varying voltage levels. The circuit and methods of testing and programming the memory cells 14 are disclosed in commonly assigned application Ser. No. 08/421,744, filed Apr. 14, 1995, titled "Integrated Zener-Zap Nonvolatile Memory Cell With Programming And Pretest Capability", and which is hereby incorporated by reference.

According to the embodiment shown in FIG. 1, the temperature dependent voltage generator 26 receives null code binary signals from the programmable memory 12 via line 16E. The temperature dependent voltage generator 26 therefore receives up to six bits of code according to the embodiment shown. Also included is a voltage to current converter 100 for converting the received transducer outputs SP and SM to a current signal. A primary gain code block 102 is coupled to line 16A and a gain range code block 104 is coupled to line 16F. A temperature compensation gain code block 106 and temperature compensation offset code block 108 are coupled to lines 16C and 16D. A main signal multiplier 110 and inverter 112 feed an inverting input (–) of an operational amplifier 116. Operational amplifier 116 further includes a non-inverting input (+) for receiving a reference voltage $V_{REF}$. In effect, gain and offset of the operational amplifier 116 are adjustable via the inverting (–) input thereof. A detailed description of blocks 100–116 is provided in commonly assigned application Ser. No. 08/422,153, filed Apr. 14, 1995 titled "Integrated Transducer Amplifier With Zener-Zap Programming" and application Ser. No. 08/421,956, filed Apr. 14, 1995 titled "Programmable Transducer Amplifier Circuit", and which are hereby incorporated by reference.

The transducer amplifier circuit 10 is adapted for use in a vehicle (not shown), such as an automobile. More particularly, this invention will be described for use in conditioning signals from a pressure transducer or a motion/accelerometer or other similar sensing device. However, it is to be understood that the use of this invention is not restricted to automobiles, amplifiers, transducers or sensors, but could have other uses in other applications requiring signal conditioning in order to compensate for variations due to changes in operating temperature.

When employed in an environment with changing temperatures, the physical characteristics of the amplifier circuit 10 and/or the transducer are affected such that unwanted variations in the output voltage $V_{OUT}$ are generated. Therefore, in order to compensate for these variations, the amplifier circuit 10 includes the temperature dependent voltage generator 26, illustrated by block (D), which produces an output voltage that is used to compensate for such variations in temperature.

When a conditioning circuit such as amplifier circuit 10 exhibits characteristic changes due to temperature, it is desirable to compensate for the effects of temperature variation. To do so, a linear function of temperature may be used to compensate for such effects. A linear function of temperature may generally be expressed by the following equation:

$$F(T) = K_A * T + K_B,$$

where adjustable coefficients $K_A$ and $K_B$ define slope and offset, respectively, for a given application. This may be accomplished by monitoring F(T) at two different temperatures T and adjusting coefficients $K_A$ and $K_B$ accordingly. However, this adjustment procedure is complicated by the fact that at any non-zero temperature T, both coefficients $K_A$ and $K_B$ affect the value of F(T) and generally cannot be adjusted independently. Therefore, it is desirable to develop a method of decoupling the effects of the slope and offset coefficients $K_A$ and $K_B$ on the linear temperature function F(T) such that independent adjustment of one of the coefficients at a non-zero temperature T can be achieved. Thus, the second coefficient can then be adjusted at a new temperature T by monitoring the change in the value of F(T) from the first temperature. According to the above decoupling, the linear function of temperature may be expressed by the following equation:

$$F(T)=K_x*(T-T_n)+K_y,$$

where $K_x$, $K_y$ and $T_n$ are adjustable coefficients and T is the operating temperature. As can be seen, F(T) is equal to the coefficient $K_y$ at temperature $T=T_n$ regardless of the value of the coefficient $K_x$. Therefore, the coefficient $K_x$ can be adjusted at any temperature without affecting the value of $F(T_n)$. This allows for independent adjustment of the coefficient $K_y$ at temperature $T=T_n$ and independent adjustment of the coefficient $K_x$ at any other temperature T.

As will be apparent to one skilled in the art, in order to realize the linear function of temperature F(T) and the decoupled two temperature adjustment method, a voltage signal may be generated as follows:

$$V(T)=K_x*(T-T_n)$$

With particular reference to FIG. 2, a first embodiment of the temperature dependent voltage generator circuit 26 is illustrated therein. The voltage generator circuit 26 is generally capable of generating an output voltage as a function temperature similar to the aforementioned equation defining V(T). In the above equation, T represents the operating temperature of the voltage generator circuit 26, whereas $T_n$ represents an adjustable temperature term, and $K_x$ represents a scaling or slope factor. Thus, the output voltage V(T) is proportional to the difference between the operating temperature T and the adjustable temperature $T_n$. As will be discussed in detail below, the voltage generator circuit 26 is designed such that parameters representing the adjustable temperature term $T_n$ can be easily adjusted. Therefore, at any operating temperature T, the output voltage V(T) can be "nulled" or forced equal to zero by adjusting the adjustable temperature term $T_n$ to equal the operating temperature T. Thereafter, with changes in the operating temperature T, the output voltage V(T) will be proportional to the difference between a given operating temperature T and the adjusted temperature term $T_n$. As will be apparent to one skilled in the art, generating a voltage of the form V(T) generally allows the aforementioned linear function of temperature F(T) to be realized.

In particular, the temperature dependent voltage generator circuit 26 includes a constant current source $I_1$, biased by voltage supply Vcc, which forces a constant current into a pair of series connected silicon diodes $D_1$ and $D_2$ which in turn are coupled to ground (GND). Diodes $D_1$ and $D_2$ have forward voltage drops which are temperature dependent. Accordingly, the constant current forces a change in voltage in response to a change in temperature as will be discussed later hereinafter. An operational amplifier 28 has a non-inverting input (+) coupled to a node located between the constant current source $I_1$ and the series connected silicon diodes $D_1$ and $D_2$. The inverting input (−) is coupled to the output of operational amplifier 28. A resistor $R_2$ is coupled between the output of operational amplifier 28 and a binary weighted switched current source $I_2$ which, in turn, is coupled to ground. A resistor $R_1$ is coupled at a node between voltage supply Vcc and the non-inverting input (+) of an operational amplifier 30 and the binary weighted switched current $I_2$. The inverting input (−) is coupled to an output 32 of operational amplifier 30.

In operation, the constant current supplied by constant current source $I_1$ is coupled to ground by diodes $D_1$ and $D_2$. This results in a voltage $V_1$ at node N, equalling the sum of two equal diode voltage drops $V_{D1}$ and $V_{D2}$ being supplied to the non-inverting input (+) of operational amplifier 28. This voltage $V_1$ is buffered by the operational amplifier 28 to resistor $R_2$. In accordance with the preferred embodiment, resistor $R_1$ and resistor $R_2$ have equal resistances such that a voltage $V_2$ equalling $Vcc/2+V_{D1}-I_2*R_1/2$ is supplied to the non-inverting input (+) of operational amplifier 30. An output voltage $V_T$ at the output 32 of operational amplifier 30 represents the difference between the reference voltage supply Vcc/2 and voltage $V_2$. Therefore, the voltage generator circuit 26 of FIG. 2 may generate an output voltage $V_T$ as follows:

$$V_T=(I_2*R_1/2-V_{D1})$$

According to one embodiment, the diode voltage $V_{D1}$ has a temperature dependence of approximately −2 mV/_C when supplied by the constant current from constant current source $I_1$. As will be discussed below, the binary switched weighted current source $I_2$ generates an adjustable binary weighted current which is substantially temperature independent by design and can be adjusted at any practical operating temperature T until $V_T$ is "nulled" or forced to zero. Because of the adjustment capability of current source $I_2$ and the characteristic of the diode voltage $V_{D1}$ varying substantially linearly with changes in temperature, the output voltage $V_T$ varies as a function of temperature in a manner similar to the above equation defining V(T).

With reference to FIG. 3, the binary weighted current source $I_2$ is illustrated in the form of a series of parallel binary weighted switched current sources, 40, 42, 44, and 46. Each of these current sources 40–46 are coupled to ground and are selectively coupled to electronic switches $S_1$, $S_2$, $S_3$, and $S_4$ to produce the adjustable binary switched current $I_2$. The electronic switches $S_1$–$S_4$ receive binary signals from memory cells 14 via lines 16E in order to be selectively closed. Each of the binary weighted current sources $S_1$–$S_4$ are weighted so as to conduct a different amount of current, i.e., $I_X$ through $I_X/8$. Each of the electronic switches $S_1$ through $S_4$ selectively couples one of the parallel binary weighted switched current sources to the binary weighted current $I_2$ for generating the current source $I_2$ that is illustrated in FIG. 2. This allows the binary weighted current $I_2$ to be adjusted in a binary fashion. For example, current source 46 sources a larger current equal to $I_X/8$ and current source 40 sources a current equal to $I_X$. Therefore, upon the closing of electronic switches S1 and S4, the binary weighted current $I_2$ has a value of $I_X+I_X/8$. As will be apparent to one skilled in the art, additional binary weighted switched current sources may be added in parallel in order to provide for a finer resolution of the adjustable binary weighted current $I_2$.

As indicated above, the adjustable binary weighted current $I_2$ is adjusted in order to "null" or force to zero the voltage $V_T$. This is accomplished by selectively closing any number of switches $S_1$–$S_4$ in order to generate the appropriate current $I_2$. Thereafter, with changes in the operating temperature T of circuit 26, the temperature dependent output voltage $V_T$ will vary proportionately with the changes in temperature. As previously mentioned, this is accomplished due to the temperature dependence of the diode voltage $V_{D1}$.

Turning to FIG. 4, an alternate embodiment of a temperature dependent voltage generator circuit 48 is shown therein. The temperature dependent voltage generator circuit 48 is generally capable of generating an output voltage as a function of temperature similar to the aforementioned equation defining V(T), whereas T now represents the operating temperature of the voltage generator circuit 48.

In particular, temperature dependent voltage generator circuit 48 includes transistors QD1, QD2, Q1 and Q2. Transistors QD1 and QD2 are preferably NPN configured bipolar transistors and are preferably configured as diode connected transistors. Transistor QD1 has a collector 50, an emitter 52, and a base 54. Transistor QD2 has a collector 56, an emitter 58, and a base 60. The collector 50 and base 54 of transistor QD1 and the collector 56 and base 60 of transistor QD2 are respectively coupled to one another. The emitter 52 of transistor QD1 is coupled to the collector 56 of transistor QD2, and the emitter 58 of transistor QD2 is coupled to ground. A constant current source $I_D$ is coupled to a reference voltage $V_{REF}$ and the collector 50 of transistor QD1. The current source $I_D$ supplies a constant current to the diode connected transistors QD1 and QD2 in a substantially temperature independent manner. Transistor Q1 includes a collector 62, an emitter 64 and a base 66. The emitter 64 is coupled to ground by resistor $R_1$. Transistor Q2 has a collector 68, an emitter 70, and a base 72. The emitter 70 of transistor Q2 is coupled to ground (GND) by resistor $R_2$. The collector 68 of transistor Q2 is coupled to the inverting input (−) of an operational amplifier 74 and to the output 76 of operational amplifier 74 by a resistor $R_4$. A resistor $R_3$ has a common connection to the non-inverting input (+) of operational amplifier 74 and the collector 62 of transistor Q1 and a connection to the reference voltage $V_{REF}$.

In operation, the diode connected transistors QD1 and QD2 are driven by the constant current from current source $I_D$. This results in a voltage equal to two forward diode voltage drops, 2 $V_{BE}$, to the base 72 of transistor Q2, and one forward diode voltage drop, $V_{BE}$, to the base 66 of transistor Q1. As a result, the voltage appearing at the emitter 70 of transistor Q2 is essentially equal to one forward diode voltage drop, $V_{BE}$. This results in a current $I_2$ being conducted by transistor Q2 having a value equal to $V_{BE}/R_2$.

The constant current from constant current source $I_D$ is generated in a dependent fashion such that $I_D = I_1$, where $I_1$ is the current conducted by transistor Q1. The voltage appearing at the emitter 64 of transistor Q1 is equal to the difference in voltage between the base to emitter voltage of transistor QD2 and the base to emitter voltage of transistor Q1. Therefore, the voltage appearing at the emitter 64 of transistor Q1 may be expressed as $kT/q*\ln(A_x)$ where k is Boltzman's constant, T is absolute temperature, $A_x$ is the ratio of emitter areas of transistor Q1 to transistor QD2, and q is charge on electron. As such, current at the emitter 64 of transistor Q1 may be represented by:

$$I_1 = kT/q*\ln(Ax)/R_1.$$

Because the voltage at the output 76 of operational amplifier 74 is expressed as $V_{REF}-V_T$, the output voltage $V_T$ may be expressed by:

$$V_T = I_1*R_3 - I_2*R_4.$$

Therefore, substituting current $I_1$ and current $I_2$ in the above equation results in the output voltage being represented by:

$$V_T = kT/q*\ln(Ax)*(R_3/R_1) - V_{BE}*(R_4/R_2).$$

In the above equation, KT/q has a temperature dependence of approximately 0.0866 mV/°C. and the voltage $V_{BE}$ has a temperature dependence of approximately −2 mV/°C.

Turning to FIG. 5, in accordance with the preferred embodiment, resistor $R_2$ of FIG. 4 has been replaced by an equivalent R-2R resistor network 78 to provide for binary adjustment of the current $I_2$. As will be apparent to one skilled in the art, the R-2R resistor network 78 is a conventional network employing resistors with resistances equalling $2R_2/3$ and $R_2/3$. The current $I_2$ represents a binary weighted current source illustrated by parallel current sources 80, 82 and 84 which source equal currents. Each of the current sources 80–84 are coupled to the R-2R resistor network via electronic switches $S_0$, $S_1$, and $S_2$. As explained in accordance with FIG. 3, switches $S_0$–$S_2$ receive binary signals from memory cells 14 in order to be selectively closed.

As discussed above, in operation, the voltage appearing at the base 72 of transistor Q2 is equal to two diode drops, 2 $V_{BE}$, across transistors QD1 and QD2. The current $I_2$ flowing through transistor Q2 is now a binary weighted current which may be expressed as follows:

$$I_2 = V_{BE}/R_2 + IN*(S_2/2 + S_1/4 + S_0/8),$$

where $S_0$, $S_1$ and $S_2$ have a value of 0 or 1 depending on the status of the respective switches, i.e., 0 if a switch is open and 1 if a switch is closed. As such, the voltage $V_T$ may now be represented by the following equation:

$$V_T = kT/q*\ln(Ax)*(R_3/R_1) - V_{BE}*(R_4/R_2) - IN*R4*(S_2/2 + S_1/4 + S_0/8),$$

where T is the operating temperature of circuit 48. Thus, by selectively closing the switches $S_0$–$S_2$, current $I_2$ may be weighted in a binary fashion in order to "null" or force to zero the voltage $V_T$. As discussed above, the base to emitter voltage $V_{BE}$ and the term KT/q vary substantially linearly with changes in temperature. Therefore, because of this temperature dependence and the ability to weight the current $I_2$, the voltage $V_T$ can be "nulled" or forced to zero. Thereafter, the voltage $V_T$ will vary proportionally with changes in the temperature T.

Accordingly, the present invention provides a temperature dependent voltage that may be used to compensate for temperature dependent characteristics. The voltage may be nulled at a temperature to calibrate characteristics of a circuit. Thereafter, temperature compensation may be realized.

Figure 6:
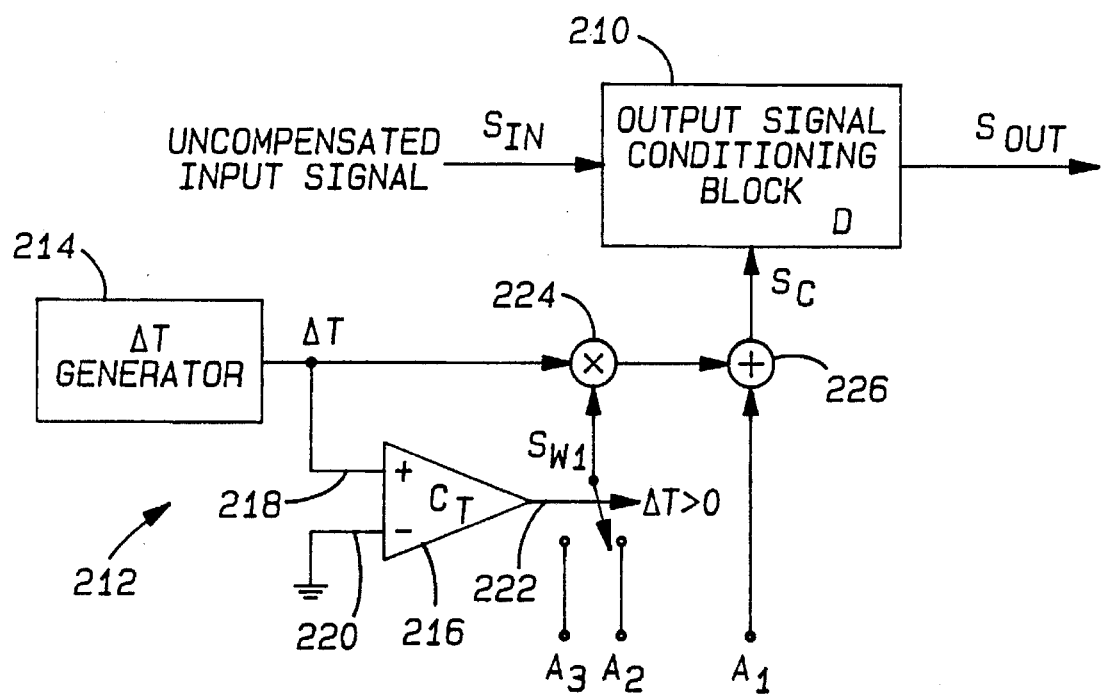
FIG. 6 is a circuit diagram illustrating a first embodiment of the temperature dependent signal compensation circuit in accordance with the present invention.
Figure 7:
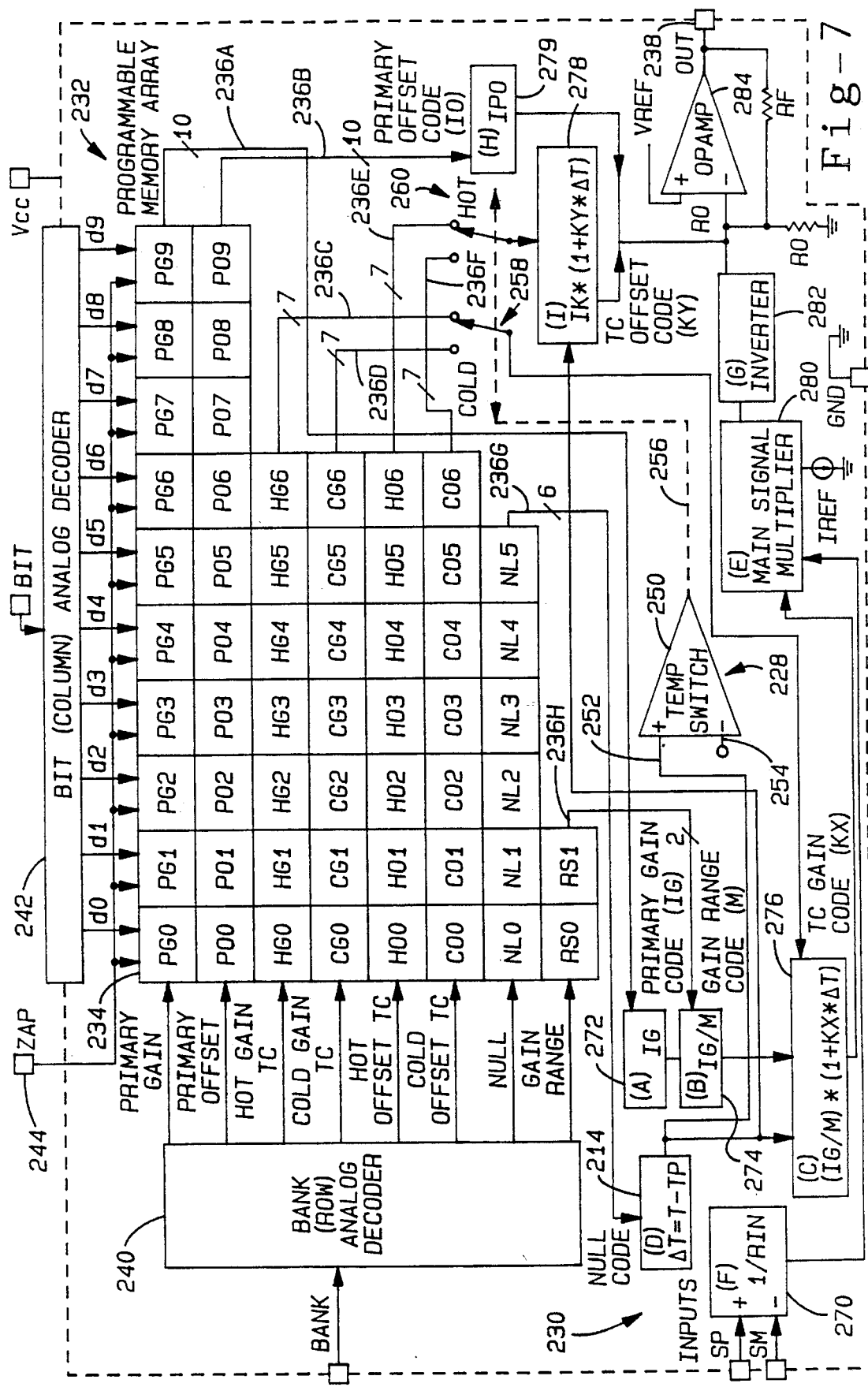
FIG. 7 is a block diagram of a piezoresistive transducer amplifier circuit containing a second embodiment of the temperature dependent signal compensation circuit in accordance with the present invention.

With reference to FIGS. 6 and 7, two embodiments of a temperature dependant signal compensation circuit and a method for generating a dual sloped compensation signal that provides signal compensation for a piezoresistive transducer amplifier are illustrated.

With particular reference to FIG. 6, an output signal conditioning block 210 that receives an uncompensated input signal $S_{IN}$ and outputs a signal $S_{OUT}$ is shown. The uncompensated input signal $S_{IN}$ may be a signal received from a piezoresistive transducer (not shown) or any other type of signal that requires signal compensation for unwanted effects due to temperature variations. The output signal conditioning block 210 may include a piezoresistive transducer amplifier circuit or any other suitable signal conditioning circuitry. When employed in an environment with changing temperatures, the physical characteristics of the output signal conditioning block 210 and/or an accompanying transducer may be effected such that unwanted variations in the signal $S_{OUT}$ are generated. Therefore, in order to compensate for these variations, a temperature dependent signal compensation circuit 212 generates a dual sloped compensation signal $S_C$ that is passed to the output signal conditioning block 210. As will be discussed in detail below, the compensation signal $S_C$ is responsive to changes in the operating temperature of the temperature dependent signal compensation circuit 212 and changes slope accordingly.

The temperature dependent signal compensation circuit 212 includes a temperature dependent voltage generator circuit block 214 that includes the previously discussed temperature dependant voltage generator circuit 26 or 48. As such, the temperature dependant voltage generator circuit block 214 generates the aforementioned output voltage V(T) which is represented by _T. The temperature dependent signal compensation circuit 212 further includes a comparator circuit 216 having a non-inverting (+) input 218 and an inverting (−) input 220 as well as an output line 222. The output line 222 is coupled to an electronic switch represented by $S_{W1}$. The output voltage V(T) from the temperature dependent voltage generator circuit 214 is coupled to the non-inverting (+) input 218 for comparison with a ground reference signal that is coupled to the inverting (−) input 220. The output signal from comparator circuit 216 changes state between a high and a low signal in response to the comparison which in turn causes the electronic switch $S_{W1}$ to switch between a pair of slope calibration signals $A_2$ and $A_3$. The slope calibration signals $A_2$ and $A_3$ may be electronically programmable binary signals that are programmed to have different valves for providing different levels of calibration when the signal compensation circuit 212 is exposed to different operating temperatures. The electronic switch $S_{W1}$ is coupled to the output voltage V(T) of the voltage generator circuit 214 by a multiplier circuit 224. An additional calibration signal $A_1$ is added to the resulting signal exiting the multiplier circuit 224 by a summing circuit 226. The dual sloped compensation signal $S_C$ exits the summing circuit 226 and is coupled to the output signal conditioning block 210.

The signal compensation circuit 212 is adapted for use with a transducer amplifier circuit that preferably may be used in a vehicle (not shown), such as an automobile. More particularly, this invention will be described for use in conditioning signals from a pressure transducer or a motion/accelerometer or other similar sensing device. However, it is to be understood that the use of this invention is not restricted to automobiles, amplifiers, transducers or sensors, but could have other uses in other applications requiring signal conditioning in order to compensate for variations due to changes in operating temperature.

When a conditioning circuit such as output signal conditioning block 210 exhibits characteristic changes due to temperature, it is desirable to compensate for the effects of temperature variation. As discussed in conjunction with the compensation of the piezoresistive transducer amplifier circuit 10 of FIG. 1, the linear function of temperature F(T) may be used to compensate for such effects. In accordance with the above described linear temperature compensation method, the linear function of temperature may be expressed by the following equation:

$$F(T)=K_x^* (T-T_n)+K_y,$$

where $K_x$, $K_y$ and $T_n$ are adjustable coefficients and T is the operating temperature. In order to obtain improved compensation over a larger spectrum of temperature, the slope coefficient $K_x$ may switch between two independent values depending upon the operating temperature T. As such, with reference to the temperature dependent signal compensation circuit 212, a dual sloped function of a temperature and compensation method may generally be expressed by the following equations:

$$S_c(T)=A_2^*(T-T_n)+A_1 \text{ for } T>T_n,$$

$$S_c(T)=A_3^* (T-T_n)+A_1 \text{ for } T<T_n, \text{ and}$$

$$S_c(T)=A_1 \text{ for } T=T_n,$$

where $A_2$ and $A_3$ define two different slopes and $A_1$ defines offset for a given application. As will be apparent to one skilled in the art, coefficients $A_1$–$A_3$ also represent the aforementioned calibration signals. The dual sloped compensation method may be accomplished by monitoring $S_c(T)$ at three different temperatures T and adjusting coefficients $A_1$–$A_3$ accordingly. As can be seen, $S_c(T)$ is equal to the offset coefficient $A_1$ at temperature $T=T_n$ regardless of the value of the slope coefficients $A_2$ or $A_3$. Therefore, the slope coefficients $A_2$ or $A_3$ can be adjusted at any temperature without affecting the value of $S_c(T_n)$. This allows for independent adjustment of the offset coefficient $A_1$ at temperature $T=T_n$, independent adjustment of the slope coefficient $A_2$ at a temperature $T>T_n$, and independent adjustment of the slope coefficient $A_3$ at a temperature $T<T_n$. As such, in addition to decoupling the effects of the slope and offset coefficients on the dual sloped function of temperature $S_c(T)$, the effects of the two slope coefficients $A_2$ and $A_3$ are decoupled and independently adjustable.

In accordance with the previous discussion of the temperature dependent voltage generator circuits 26 and 48, the voltage generator circuit 214 is generally capable of generating an output voltage that may be represented by the following equation:

$$V(T)=K_x^*(T-T_n).$$

When applied in signal compensation circuit 212, T represents the operating temperature of the voltage generator circuit 214, $T_n$ represents an adjustable temperature term, and $K_x$ represents the slope coefficients $A_2$ or $A_3$. Thus, the output voltage V(T) is proportional to the difference between the operating temperature T and the adjustable temperature $T_n$. As with the voltage generator circuits 26 and 48, the voltage generator circuit 214 is designed such that parameters representing the adjustable temperature term $T_n$ can be easily adjusted. Therefore, at any operating temperature T, the output voltage V(T) can be "nulled" or forced equal to zero by adjusting the adjustable temperature term $T_n$ to equal the operating temperature T. Thereafter, with changes in the operating temperature T, the output voltage V(T) will be proportional to the difference between a given operating temperature T and the adjusted temperature term $T_n$. As will be apparent to one skilled in the art, generating a voltage of the form V(T) generally allows the aforementioned dual sloped function of temperature $S_c(T)$ to be realized.

In order to generate the dual sloped compensation signal $S_c$, the temperature dependent signal compensation circuit 212 and conditioning block 210 are operated at a first temperature $T=T_n$. At this first temperature, the temperature dependent voltage generator circuit 214 is adjusted such that the output voltage V(T) is nulled or forced to equal zero. The voltage generator circuit 214 may be adjusted in accordance with the method previously described in conjunction with voltage generator circuits 26 and 48. Therefore, the calibration signal $A_1$ may be adjusted such that the signal $S_{out}$ exhibits desired characteristics. Next, the signal compensation circuit 212 is operated at a second operating temperature $T>T_n$ such that the output voltage V(T) from the voltage generator 214 has a positive value. As such, the comparator circuit 216 will generate a high signal on line 222 such that switch $S_{W1}$ couples slope calibration signal $A_2$ to the multiplier circuit 224. This allows the slope calibration signal $A_2$ to be adjusted until the signal $S_{out}$ exhibits the desired characteristics. Lastly, the signal compensation circuit 212 is operated at a third operating temperature $T<T_n$ such that the output voltage V(T) from the voltage generator 214 has a negative value. This will cause the comparator circuit 216 to generate a low signal on line 222 such that the switch $S_{W1}$ couples slope calibration signal $A_3$ to the multiplier circuit 224. This allows the slope calibration signal $A_3$ to be independently adjusted until the signal $S_{out}$ exhibits the desired characteristics. It should be noted that the method of calibration may be reversed such that the second operating temperature is at a temperature $T<T_n$ and the third operating temperature is at a temperature $T>T_n$ with the slope calibration signals $A_2$ and $A_3$ being adjusted accordingly.

Turning now to FIG. 7, a temperature dependent signal compensation circuit 228 in accordance with a second embodiment of the present invention is shown implemented with a piezoresistive transducer amplifier circuit 230. The signal compensation circuit 228 includes the temperature dependent voltage generator 214. As with piezoresistive transducer amplifier circuit 10, the amplifier circuit 230 is shown interconnected to an electronically programmable memory array 232 which employs "zener-zap" memory cells 234. According to the example shown, the transducer amplifier circuit 230 has inputs for receiving differential outputs SP and SM from a piezoresistive transducer (not shown). The amplifier circuit 230 of the present invention is particularly suited for use in conjunction with a piezoresistive strain sensing transducer such as a pressure or an accelerometer transducer. These transducer outputs are typically very small and therefore require amplification to an amplitude that is more easily usable.

Each of the memory cells 234 have outputs that are coupled to the amplifier circuit 230 and the signal compensation circuit 228 via lines 236A–236H. The transducer amplifier circuit 230 and the signal compensation circuit 228 receive programmed binary bit signals which are provided by each of the memory cells 234. The binary bit signals provide digital coding which is used to program the amplifier circuit 230 and the signal compensation circuit 228. The amplifier circuit 230 amplifies the transducer outputs SP and SM such that a compensated calibrated single-ended output voltage $V_{OUT}$ is generated at output line 238.

Each of the memory cells 234 in the electronically programmable memory array 232 are individually addressable via row decoder 240 and column decoder 242. Each of the memory cells 234 receive row and column address voltages from the decoders 240 and 242. When properly addressed, the memory cells 234 can be individually tested and/or programmed so as to output binary signals for adjusting amplifier characteristics, such as gain and offset, of the transducer amplifier circuit 230 and for adjusting the signal compensation circuit 228. In order to minimize the number of interconnections required for individually testing and/or programming the memory cells 234, each of the memory cells 234 have a common connection to a zap voltage line 244. The zap voltage line 244 is coupled to a voltage supply which provides varying voltage levels. The circuit and methods of testing and programming the memory cells 234 are disclosed in commonly assigned application Ser. No. 08/421,774, filed Apr. 14, 1995, titled "Integrated Zener-Zap Nonvolatile Memory Cell With Programming And Pretest Capability", and which is hereby incorporated by reference.

With particular reference to the temperature dependent compensation circuit 228, the temperature dependent voltage generator 214 receives null code binary signals from the programmable memory array 232 via line 236G. The temperature dependent voltage generator 214 therefore receives up to six bits of code according to the embodiment shown. This allows for the output voltage V(T) to be "nulled" or forced equal to zero by adjusting the adjustable temperature term $T_n$ to equal the operating temperature T. Thereafter, with changes in the operating temperature T, the output voltage V(T) will be proportional to the difference between a given operating temperature T and the adjusted temperature term $T_n$.

The temperature dependent compensation circuit 228 further includes a comparator circuit 250 having a non-inverting (+) input 252 and an inverting (−) input 254 as well as an output line 256. The output line 256 is coupled to a first electronic switch 258 and a second electronic switch 260. In operation, the output voltage V(T) from the temperature dependent voltage generator 214 is coupled to the non-inverting (+) input 252 for comparison with a ground reference signal that is coupled to the inverting (−) input 254. The output from the comparator circuit 250 changes state between a high and a low signal in response to the comparison which in turn causes the electronic switch 258 to switch between lines 236C and 236D and the electronic switch 260 to switch between lines 236E and 236F.

The amplifier circuit 230 includes a voltage to current converter 270 for converting the received transducer outputs SP and SM to a current signal. A primary gain code block 272 is coupled to line 236A and a gain range code block 274 is coupled to line 236H. A temperature compensation gain code block 276 is coupled to lines 236C and 236D by the first electronic switch 258. A temperature compensation offset code block 278 is coupled to lines 236E and 236F by the second electronic switch 260. A primary offset code block 279 is coupled to line 236B. A main signal multiplier 280 and an inverter 282 feed an inverting input (−) of an operational amplifier 284. The operational amplifier 284 further includes a non-inverting input (+) for receiving a reference voltage $V_{REF}$. In effect, gain and offset of the operational amplifier 284 are adjustable via the inverting (−) input thereof. The detailed description of blocks 270–280 correspond with the detailed description of blocks 100–116 of the operational amplifier 116 of FIG. 1.

In operation, the transducer amplifier circuit 230 is operated at a first operating temperature and the voltage generator circuit 214 receives binary coded signals via line 236G such that the output voltage V(T) is "nulled" or forced equal to zero. The output voltage V(T) is coupled to temperature compensation gain code block 276 and to temperature compensation offset code block 278. At this first operating temperature, the primary gain code block 272, the gain range code block 274, and the primary offset code block 279 are all adjusted via binary coded signals received from lines 236A, 236H, and 236B respectively, such that the amplifier circuit 230 exhibits a desired output voltage at line 238. Next, the amplifier circuit 230 is operated at a second operating temperature which exceeds the first operating temperature. In response, the temperature dependent voltage generator 214 outputs a positive voltage signal which is coupled to the non-inverting (+) input 252 of the comparator circuit 250. This causes the comparator circuit 250 to output a high signal on line 256 such that the first electronic switch 258 couples line 236C to the temperature compensation gain code block 276. Likewise, the second electronic switch 260 couples line 236E to the temperature compensation offset code block 278. At the second operating temperature, the temperature compensation gain code block 276 and the temperature compensation offset code block 278 are adjusted via binary coded signals received from lines 236C and 236E respectively. In effect, this couples the binary coded signals to the output voltage from the voltage generator 214 such that the amplifier circuit 230 exhibits a desired output voltage at line 238. Lastly, the amplifier circuit 230 is operated at a third operating temperature which is below the first operating temperature. In response, the temperature dependent voltage generator 214 outputs a negative voltage signal which is coupled to the non-inverting (+) input 252 of the comparator circuit 250. This causes the comparator circuit 250 to output a negative voltage signal on the line 256 which causes the first electronic switch 258 to couple line 236D to the temperature compensation gain code block 276. Likewise, the second electronic switch 260 couples line 236F to the temperature compensation offset code block 278. At this third operating temperature, the temperature compensation gain code block 276 and the temperature compensation offset code block 278 are adjusted via binary coded signals received from lines 236D and 236F respectively. Again, this couples the binary coded signals to the output voltage from the voltage generator 214 such that amplifier circuit 230 exhibits a desired output voltage about line 238.

Figure 8:
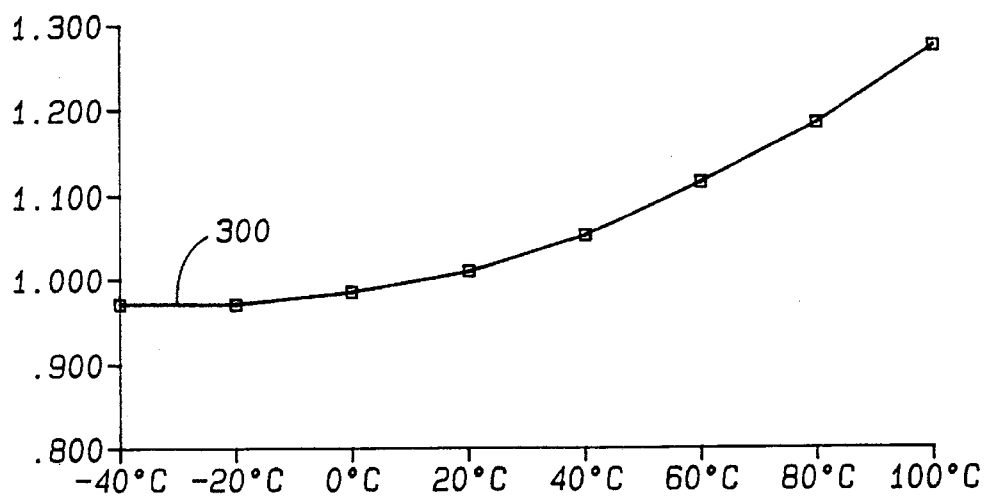
FIG. 8 is a graph representing signal gain versus operating temperature prior to the application of signal compensation for the piezoresistive amplifier circuit illustrated in FIG. 1.

Referring now to FIG. 8, a graph 300 representing the signal gain versus operating temperature of the piezoresistive transducer amplifier circuit 10 of FIG. 1 prior to the application of signal compensation is shown. As will be apparent to one skilled in the art, as the operating temperature of the amplifier circuit 10 increases, the signal gain increases which may result in an inaccurate reading from amplifier circuit 10.

Figure 9:
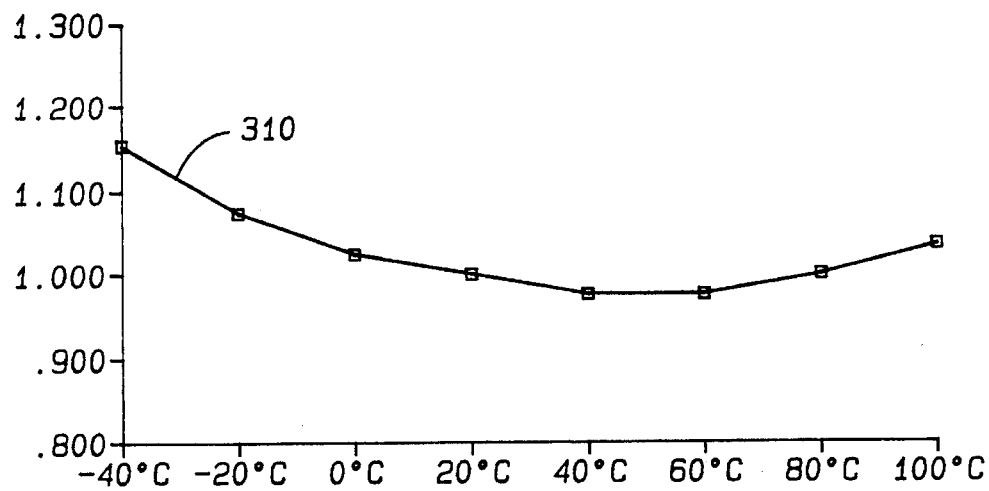
FIG. 9 is a graph representing signal gain versus operating temperature for the piezoresistive transducer amplifier circuit illustrated in FIG. 1 that has been compensated by linear temperature compensation.

Next turning to FIG. 9, a graph 310 of the signal gain versus operating temperature of the piezoresistive transducer amplifier circuit 10 of FIG. 1 is shown after being compensated by linear temperature compensation. The linear temperature compensation has been optimized at operating temperatures equalling 20° C. and 80° C. As will be apparent to one skilled in the art, the graph illustrates that the error introduced due to changes in the operating temperature has been reduced for operating temperatures above 20° C. when compared to the graph 300 of FIG. 8.

Figure 10:
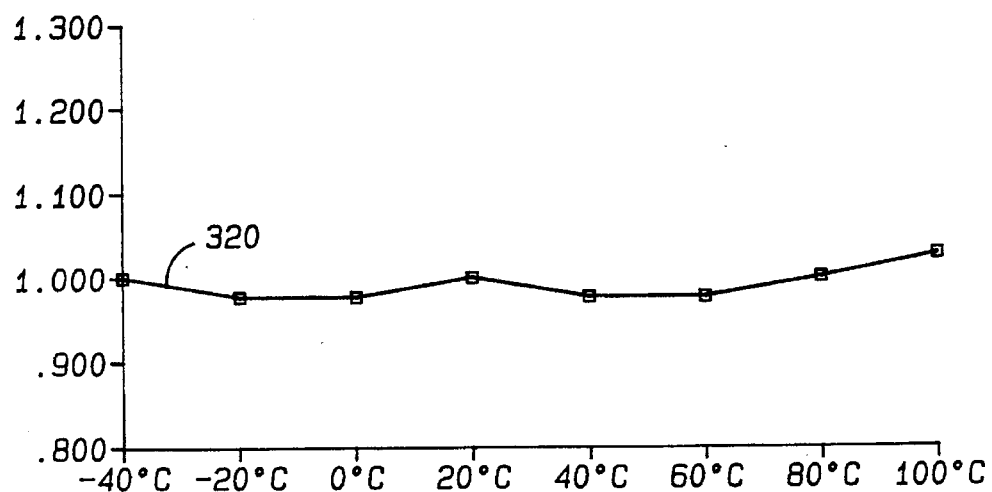
FIG. 10 is a graph representing signal gain versus temperature for the piezoresistive transducer amplifier circuit of FIG. 7 that has been compensated by a dual sloped compensation signal in accordance with the present invention.

Next turning to FIG. 10, a graph 320 of the signal gain versus operating temperature of the amplifier circuit 230 is shown. The dual sloped function of temperature and compensation method has been optimized at operating temperatures equalling −20° C., 20° C., and 80° C. The graph 320 illustrates that the error introduced due to changes in the operating temperature has been reduced for the entire temperature spectrum when compared to the graphs 300 and 310 of FIGS. 8 and 9.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A temperature dependent signal compensation circuit for generating a dual sloped compensation signal being responsive to changes in operating temperature of said signal compensation circuit, comprising:

a temperature dependent voltage generator subcircuit for generating an output voltage being substantially proportional to the changes in said operating temperature of said signal compensation circuit from a first operating temperature; and switching means, coupled to said voltage generator subcircuit, for selectively switching between and coupling a first slope calibration signal and a second slope calibration signal to said output voltage of said voltage generator subcircuit in response to the changes in the operating temperature, whereby said dual sloped compensation signal is generated through the coupling of said first and said second sloped calibration signals with said output voltage.

2. The temperature dependent signal compensation circuit of claim 1, wherein said temperature dependent voltage generator subcircuit includes:

temperature dependent voltage source means for generating a voltage that varies substantially linearly with the changes in said operating temperature from said first operating temperature; and binary weighted switched current source means for generating an adjustable binary weighted current, whereby said binary weighted switched current source means is adjustable at said first operating temperature so as to null said output voltage, and thereafter at other operating temperatures, said output voltage is proportional to the changes in the operating temperature from said first operating temperature.

3. The temperature dependent signal compensation circuit of claim 1, wherein said switching means includes:

a comparator subcircuit for comparing said output voltage from said temperature dependent voltage generator subcircuit with a reference voltage, said comparator subcircuit generates a first signal when said output voltage is positive and generates a second signal when said output voltage is negative; and at least one electronic switch, coupled to said comparator subcircuit for switching between said first and said second slope compensation signals as a function of the comparison of said reference voltage with said output voltage of said voltage generator subcircuit.

4. The temperature dependent signal compensation circuit of claim 2, wherein said temperature dependent voltage source means includes a temperature dependent element coupled to a constant current for providing a voltage that is proportional to the changes in said operating temperature from said first operating temperature.

5. The temperature dependent voltage signal compensation circuit of claim 4, wherein said temperature dependent voltage source means further includes a current source that is substantially temperature independent for generating said constant current.

6. The temperature dependent signal compensation circuit of claim 4, wherein said temperature dependent element includes at least one diode.

7. The temperature dependent signal compensation circuit of claim 4, wherein said temperature dependent element includes at least one diode connected transistor.

8. The temperature dependent signal compensation circuit of claim 2, wherein said binary weighted switched current source means includes at least one current source and at least one electronic switch, whereby said at least one electronic switch selectively couples said at least one current source to said adjustable binary weighted current for weighting said binary weighted current.

9. The temperature dependent signal compensation circuit of claim 2, wherein said binary weighted switched current source means includes a plurality of parallel current sources and a plurality of electronic switches, whereby each of said plurality of electronic switches selectively couples one of said plurality of current sources to said adjustable binary weighted current for weighting said adjustable binary weighted current.

10. A temperature dependent signal compensation circuit for generating a dual sloped compensation signal being responsive to changes in operating temperature of said signal compensation circuit, comprising:

a temperature dependent voltage generator subcircuit for generating an output voltage being substantially proportional to the changes in said operating temperature of said signal compensation circuit from a first operating temperature, said voltage generator subcircuit including temperature dependent voltage source means for generating a voltage that varies substantially linearly with the changes in said operating temperature from said first operating temperature, and binary weighted switched current source means for generating an adjustable binary weighted current, whereby said binary weighted switched current source means is adjustable at said first operating temperature so as to null said output voltage, and thereafter at other operating temperatures, said output voltage is proportional to the changes in the operating temperature from said first operating temperature;

a comparator subcircuit, coupled to said voltage generator subcircuit, for comparing said output voltage from said voltage generator subcircuit with a reference voltage, said comparator subcircuit generates a first signal when said output voltage is positive and generates a second signal when said output voltage is negative; and at least one electronic switch, coupled to said comparator subcircuit for selectively switching between and coupling a first slope calibration signal and a second slope calibration signal to said output voltage of said voltage generator subcircuit in response to the changes in said operating temperature, said at least one electronic switch switching between said first and said second slope compensation signals as a function of the comparison of said reference voltage with said output voltage of said voltage generator subcircuit, whereby said dual sloped compensation signal is generated through the coupling of said first and said second sloped calibration signals with said output voltage.

11. The temperature dependent signal compensation circuit of claim 10, wherein said temperature dependent voltage source means includes a temperature dependent element coupled to a constant current for providing a voltage that is proportional to the changes in said operating temperature from said first operating temperature.

12. The temperature dependent voltage signal compensation circuit of claim 11, wherein said temperature dependent voltage source means further includes a current source that is substantially temperature independent for generating said constant current.

13. The temperature dependent signal compensation circuit of claim 11, wherein said temperature dependent element includes at least one diode.

14. The temperature dependent signal compensation circuit of claim 11, wherein said temperature dependent element includes at least one diode connected transistor.

15. The temperature dependent signal compensation circuit of claim 10, wherein said binary weighted switched current source means includes at least one current source and at least one electronic switch, whereby said at least one electronic switch selectively couples said at least one current source to said adjustable binary weighted current for weighting said binary weighted current.

16. A method of generating a dual sloped compensation signal being responsive to changes in operating temperature of a temperature dependent signal compensation circuit, said signal compensation circuit including a temperature dependent voltage generator subcircuit for generating an output voltage being substantially proportional to the changes in said operating temperature of said signal compensation circuit from a first operating temperature, said output voltage being combined with a plurality of calibration signals for generating said dual sloped compensation signal, said method comprising the steps of:

(a) operating said compensation circuit at said first operating temperature;

(b) adjusting a first of said plurality of calibration signals at said first operating temperature;

(c) operating said compensation circuit at a second operating temperature that exceeds said first operating temperature;

(d) selecting a second of said plurality of calibration signals in response to the change in the operating temperature from said first operating temperature;

(e) adjusting said second calibration signal at said second operating temperature;

(f) operating said compensation circuit at a third operating temperature that is below said first operating temperature;

(g) selecting a third of said plurality of calibration signals in response to the change in the operating temperature from said first operating temperature; and (h) adjusting said third calibration signal at said third operating temperature.

17. The method of claim 16 wherein said steps (f), (g), and (h) are performed prior to said steps (c), (d), and (e).

18. The method of claim 16 which further comprises the step of:

(i) calibrating said temperature dependent voltage generator subcircuit at said first operating temperature so as to zero out said output voltage.

19. The method of claim 18 wherein said step (i) includes the step of:

closing a first electronic switch for coupling a first current source of a series of current sources to said binary weighted current, whereby said first current source provides current for weighting said binary weighted current.

20. The method of claim 19 wherein said step (i) further includes the step of:

closing a second electronic switch for coupling a second current source of said series of current sources to said binary weighted current, whereby said second current source provides current for further weighting said binary weighted current.

21. The method of claim 20 wherein said steps (d) and (g) each include the steps of:

comparing said output voltage with a reference signal; and switching between said second and third calibration signals as a function of the comparison of said output voltage with said reference signal.

* * * * *